(12) United States Patent
Mazur et al.

(10) Patent No.: US 6,936,383 B2
(45) Date of Patent: Aug. 30, 2005

(54) METHOD OF DEFINING THE DIMENSIONS OF CIRCUIT ELEMENTS BY USING SPACER DEPOSITION TECHNIQUES

(75) Inventors: Martin Mazur, Pulsnitz (DE); Carsten Hartig, Meerane (DE); Georg Sulzer, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 308 days.

(21) Appl. No.: 10/306,319

(22) Filed: Nov. 27, 2002

(65) Prior Publication Data

US 2004/0002217 A1 Jan. 1, 2004

(30) Foreign Application Priority Data

Jun. 27, 2002 (DE) .......................................... 102 28 807

(51) Int. Cl.[7] .......................... G03F 9/00; H01L 21/302
(52) U.S. Cl. .......................... 430/5; 438/692; 438/696; 438/700; 438/952; 438/981
(58) Field of Search ................................ 438/692, 696, 438/700, 952, 981, 694, 702; 430/5

(56) References Cited

U.S. PATENT DOCUMENTS

| | | | |
|---|---|---|---|
| 5,328,810 A | 7/1994 | Lowrey et al. ............. | 430/313 |
| 6,140,180 A | 10/2000 | Hong ......................... | 438/255 |
| 6,191,041 B1 | 2/2001 | Liao ............................ | 438/694 |
| 6,255,202 B1 | 7/2001 | Lyons et al. ................ | 438/585 |
| 2002/0037617 A1 | 3/2002 | Kim et al. .................. | 438/270 |

FOREIGN PATENT DOCUMENTS

JP          10223756          8/1998

*Primary Examiner*—George A. Goudreau
(74) *Attorney, Agent, or Firm*—Williams, Morgan & Amerson, P.C.

(57) ABSTRACT

By using conventional spacer and etch techniques, microstructure elements, such as lines and contact openings of integrated circuits, may be formed with dimensions that are mainly determined by the layer thickness of the spacer layer. In a sacrificial layer, an opening is formed by means of standard lithography and etch techniques and, subsequently, a spacer layer is conformally deposited, wherein a thickness of the spacer layer at the sidewalls of the opening substantially determines the effective width of the microstructure element to be formed. By using standard 193 nm lithography and etch processes, gate electrodes of 50 nm and beyond can be obtained without significant changes in standard process recipes.

20 Claims, 10 Drawing Sheets

METHOD OF DEFINING THE DIMENSIONS OF CIRCUIT ELEMENTS BY USING SPACER DEPOSITION TECHNIQUES

BACKGROUND OF THE INVENTION

1. Field of the Invention

The present invention generally relates to the field of microstructure, such as integrated circuits, and, more particularly, to the formation of small elements on a substrate, wherein the dimensions of the elements are significantly less than the resolution of the involved lithographic technique.

2. Description of the Related Art

The trend in recent years to steadily decrease the feature sizes of elements in microstructures, such as circuit elements in integrated circuits, will continue in the near future, wherein reproducible and robust processes have to be established that allow the formation of a huge number of integrated circuits in a cost-efficient manner. Presently, sophisticated integrated circuits that are available as mass products include elements having dimensions which are well below the optical resolution of the lithography apparatus used for transferring a pattern from a mask to the substrate. Minimum dimensions of circuit elements are presently 100 nm and less, wherein the wavelength of radiation used for optically transferring patterns from the mask to the substrate surface are in the deep ultraviolet range, down to approximately 193 nm. In this wavelength range, the absorption of optical transmissive elements, such as lenses, is considerable and will drastically increase with a further reduction of the wavelength. Thus, merely reducing the wavelength of light sources for lithography apparatus is not a straightforward development and may not easily be implemented in mass production of circuit elements having feature sizes of 50 nm and less.

The total resolution of reliably transferring circuit patterns from a mask to a substrate is determined, on the one hand, by the intrinsic optical resolution of the photolithography apparatus, the characteristics of materials involved in the photolithography patterning process, such as the photoresist and any anti-reflective coatings (ARC) that are provided to minimize deleterious scattering and standing wave effects in the photoresist, and by deposition and etch procedures involved in forming the resist and ARC layers and etching these layers after exposure. In particular, the highly non-linear behavior of the photoresist, in combination with sophisticated ARC layers and lithography mask techniques, allows the formation of resist patterns having dimensions considerably below the intrinsic optical resolution of the photolithography apparatus. Additionally, further post-lithography trim etch processes may be applied to further reduce the feature sizes of the resist pattern that will serve as an etch mask in subsequent anisotropic steps for transferring the resist pattern into the underlying material layer.

With reference to FIGS. 1a–1c, a typical conventional process flow for forming a gate electrode of a field effect transistor will now be described. The gate electrode has a design dimension in the lateral direction, that is also referred to as gate length, on the order of 100 nm or less, and the gate electrode extends in the longitudinal direction, i.e., a direction perpendicular to the plane of the drawings, for a distance of a few hundred nanometers. The gate length of a field effect transistor is a critical dimension in that it significantly determines the electrical characteristics of the device and also provides for the capability of reducing the total area occupied by the field effect transistor. However, with the scaling of the gate length, not only the size of the field effect transistors is decreased, but also the dimensions of corresponding contact areas, conductive lines, vias and the like are subjected to a miniaturization, so that a sophisticated imagery is also necessary for these circuit elements.

In FIG. 1a, a semiconductor structure 100 comprises a substrate 101, which may, for example, be a semiconductor substrate, such as a silicon substrate, or any other appropriate substrate having formed thereon a semiconductor-containing layer that allows the formation of the required circuit elements. In particular, the substrate 101 may be a so-called SOI (silicon-on-insulator) substrate. A gate insulation layer 102 is formed on the substrate 101, the thickness of which is adapted to the design gate length. A layer of gate electrode material 103 is formed on the gate insulation layer 102 and may be comprised of any material that is appropriate for forming a gate electrode. If, for instance, a typical silicon-based semiconductor structure is considered, the gate electrode material 103 may preferably be polycrystalline silicon, which is also referred to as polysilicon. For sophisticated silicon-based integrated circuits, a thickness of the layer 103 is in the range of several hundred nanometers. On top of the layer 103 of gate electrode material, an ARC layer 104 is formed, the optical characteristics and the thickness of which are adjusted to the characteristics of the underlying layer 103 and of a photoresist layer 105 formed on top of the ARC layer 104. As previously noted, the ARC layer 104 is designed to minimize scattering and back-reflection of light from the underlying layer 103. Silicon oxynitride is frequently used as the ARC layer since the optical characteristics, such as the complex index of refraction, may be easily adjusted by varying the amount of oxygen, nitrogen and silicon during the deposition of the ARC layer 104. Moreover, the optical characteristics of the photoresist layer 105 and the ARC layer 104 are designed to minimize the formation of standing wave patterns in the photoresist layer 105.

The semiconductor structure 100 is formed according to well-established process steps and the description of these steps is omitted. Subsequently, the semiconductor structure 100 is exposed to deep UV radiation 106 to transfer a required feature pattern from a mask (not shown) into the photoresist layer 105. By means of sophisticated mask and photolithography techniques, including the precisely adjusted ARC layer 104 and the photoresist layer 105, features may be imaged into the photoresist layer 105 having dimensions beyond the wavelength of the deep UV radiation 106.

FIG. 1b schematically shows the semiconductor structure 100 after developing the photoresist layer 105, including associated post-exposure techniques, such as baking and the like, to create a resist feature 105A. A lateral dimension 107 of the feature 105A may be well beyond the wavelength of the deep UV radiation 106, and is limited by the plurality of highly complex lithography processes. Subsequently, the semiconductor structure 100 is subjected to an anisotropic etch process, indicated by 108, wherein the resist feature 105A acts as an etch mask.

FIG. 1c shows the semiconductor structure 100 after completion of the etch process in which a gate electrode, also referred to as 103, is obtained, covered by the residual ARC layer 104 and the resist feature 105A. The lateral extension 109 of the gate electrode 103, i.e., the gate length, is substantially determined by the lateral extension 107 of the resist feature 105A. After the removal of the resist feature 105A and the ARC layer 104, the gate electrode 103 may be subjected to further etch processes in order to further reduce the gate length 109. For example, an etch process may be employed in which the etch rate is substantially isotropic or at least exhibits a relatively high lateral component. By using such etch processes, however, the height of the gate electrode 103 and, more importantly, the gate insulation layer 102 are also affected, thereby possibly compromising the quality of the gate insulation layer 102.

As a result, the conventional processing allows the formation of feature sizes well beyond the wavelength of the radiation used for optically transferring images from a mask to a substrate. However, a conventional process flow relies on a plurality of complex processes to reduce the feature size of the resist feature 105A and to further reduce the dimensions of a circuit element obtained by etching a material layer using the resist pattern as an etch mask. The controllability of the final etch process and the integrity of an underlying layer are difficult to maintain. Moreover, any change in one of the process recipes, for instance the employment of a different exposure wavelength, requires corresponding changes in preceding and following processes, so that a further scaling of feature sizes typically requires a great deal of effort and time to obtain a robust-process sequence that is appropriate for mass production.

In view of the above explained problems, a need exists for a method that allows the scaling of feature sizes well beyond the resolution of the involved photolithography process, wherein well-established and controllable processes ensure high reliability and a shorter development time of a corresponding process sequence.

SUMMARY OF THE INVENTION

Generally, the present invention is directed to forming microstructure elements, such as circuit elements of integrated circuits, wherein the dimensions of the elements are defined by a hard mask instead of a resist pattern. The dimensions of the hard mask are adjusted by well-controllable deposition processes, wherein openings, such as trenches and vias, are formed in a sacrificial layer, and the sidewalls of the openings are coated with a sacrificial material, wherein a thickness of the coating substantially determines the dimensions of the finally-obtained microstructure feature.

According to one illustrative embodiment of the present invention, a method for forming a line element on a substrate comprises the provision of a substrate having formed thereon a first material layer and a second material layer that is located above the first material layer. Then, a trench is formed in the second material layer, wherein the trench exhibits a width that exceeds a design width of the line element to be formed. A spacer layer is formed on the sidewalls of the trench to reduce the trench width. Subsequently, the trench is filled with a mask material and, thereafter, the second material layer and the spacer layer are removed. The first material layer is then patterned, while the mask material is used as an etch mask to form the line element, wherein the width of the line element is determined by the reduced trench width.

In a further illustrative embodiment of the present invention, a method for forming a gate electrode of a field effect transistor comprises providing a substrate having formed thereon a semiconductor layer covered by a gate insulation layer. Next, a layer of gate electrode material is deposited on the gate insulation layer and a sacrificial layer is formed over the layer of gate electrode material. An opening is formed in the sacrificial layer, wherein a shape of the opening resembles the shape of the gate electrode to be formed, wherein the dimensions of the opening exceed the design dimensions of the gate electrode. A spacer layer is formed on the sidewalls of the opening to reduce the dimensions of the opening in conformity with the design dimensions of the gate electrode, and the opening is filled with a mask material. Subsequently, the sacrificial layer and the spacer layer are removed, and the gate electrode is patterned by anisotropic etching, using the mask material as an etch mask.

According to a further illustrative embodiment of the present invention, a method for forming an opening of a specified design size in a material layer formed on a substrate comprises providing a substrate having formed thereon a material layer in which the opening is to be formed. A sacrificial layer is formed on the material layer and a mask opening having a dimension greater than the specified design size is formed. A spacer layer is conformally deposited on the sacrificial layer to adjust a width of the opening to the specified design size. Finally, the opening is formed in the material layer by anisotropically etching the material layer through the mask opening.

BRIEF DESCRIPTION OF THE DRAWINGS

The invention may be understood by reference to the following description taken in conjunction with the accompanying drawings, in which like reference numerals identify like elements, and in which.

Figure 1A:
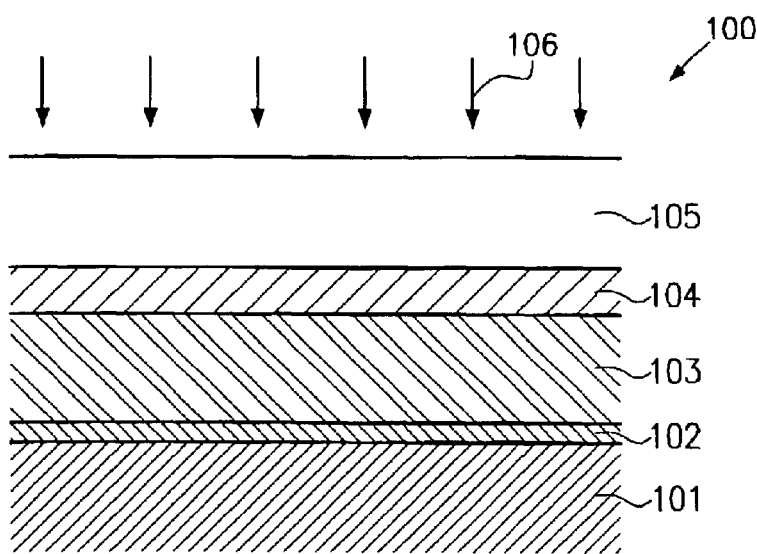
FIGS. 1*a*–1*c* schematically show cross-sectional views of a semiconductor structure during various manufacturing stages, formed according to a typical prior art process flow.
Figure 1B:
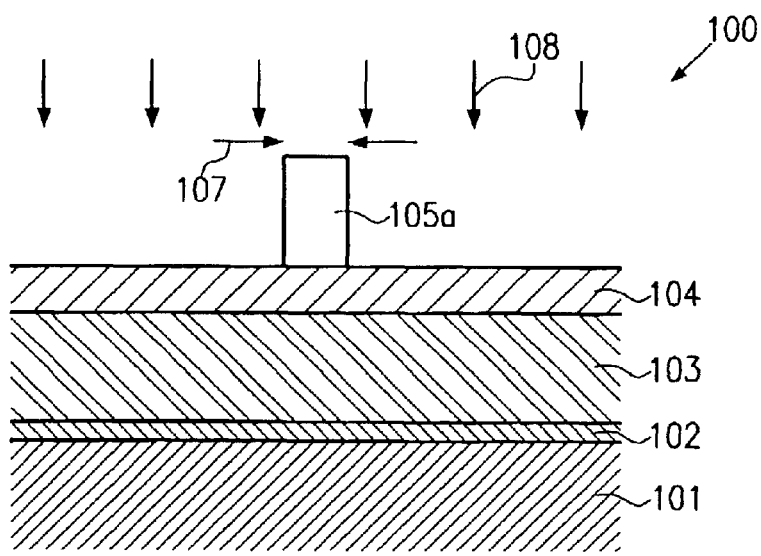
Figure 1C:
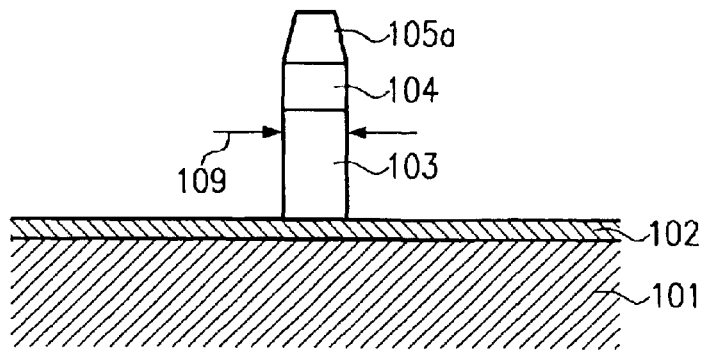

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In the following detailed description, reference will be made to semiconductor structures, representing integrated circuits, to illustrate the concept of the present invention. It is to be understood, however, that the present invention is also applicable to the formation of any microstructures requiring the formation of structure elements having dimensions that are well below the resolution of the involved photolithography technique. Moreover, the present invention is particularly advantageous in forming sophisticated microstructures, such as advanced integrated circuits having critical dimensions of 50 nm and less, wherein well-established process techniques of preceding circuit generations are used. However, the present invention is not limited to the formation of cutting-edge devices but may also be advantageously employed for the fabrication of devices including elements of feature sizes that are well within the technological capability of today's lithography techniques. However, in some cases, it may be preferable to avoid the employment of relatively expensive advanced lithography tools and define the critical feature sizes of these devices by using the methods disclosed herein.

Figure 2A:
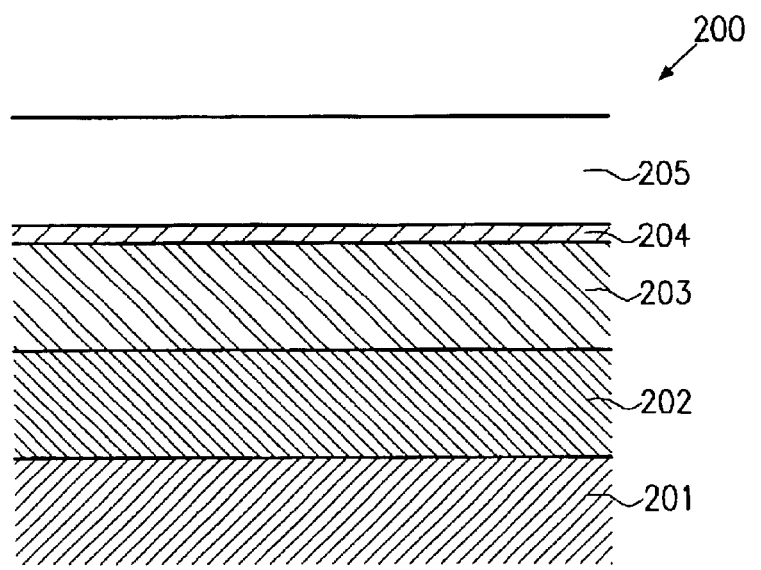
FIGS. 2*a*–2*h* schematically show cross-sectional views of a microstructure including a line element manufactured in accordance with one illustrative embodiment of the present invention.

With reference to FIGS. 2a–2h, illustrative embodiments of the present invention will now be described. In FIG. 2a, a semiconductor structure 200 comprises a substrate 201, which may be a semiconductor substrate, an insulating substrate having formed thereon a semiconductor layer, and the like, on which is formed a first material layer 202 comprised of any suitable material. For the sake of simplicity, the first layer 202 may represent a polysilicon layer in which a line element, with specified design dimensions, is to be formed. A second material layer 203, which will also be referred to as a sacrificial layer, is formed on the first material layer 202, followed by an anti-reflective coating (ARC) layer 204 having a photoresist layer 205 formed thereon. The sacrificial layer 203 may be, for example, a silicon dioxide layer and the ARC layer 204 may be a silicon oxynitride layer, the thickness and optical characteristics of which are adjusted in accordance with the overlying photoresist layer 205 and the involved lithography technique.

A typical process flow for forming the semiconductor structure 200 shown in FIG. 2a may comprise the following steps. The first layer 202 may be deposited by any known deposition process, such as chemical vapor deposition (CVD), with a thickness of the layer 202 being selected in conformity with design requirements. Subsequently, the sacrificial layer 203 is deposited by, for example, plasma enhanced CVD or low pressure CVD, from TEOS or silane, when the sacrificial layer 203 is a silicon dioxide layer. For forming line elements having lateral dimensions on the order of some tens of nanometers, a typical thickness of the sacrificial layer 203 is in the range of approximately 100–150 nm. Subsequently, the ARC layer 204 is deposited, for example, by chemical vapor deposition, wherein the optical characteristics and the thickness may be controlled to obtain the required properties. For instance, the ARC layer 204 may be a silicon oxynitride layer with a thickness in the range of approximately 50 nm and with an index of refraction of 1.8 and an extinction coefficient of 1.05 for a wavelength of the deep UV radiation of approximately 193 nm. Finally, the photoresist layer 205 is formed on top of the ARC layer 204 with a thickness that corresponds to the lithography process used for patterning the semiconductor structure 200. It is to be appreciated that the process flow for forming the semiconductor structure 200 of FIG. 2a are well-established processes and may be adopted without significant changes.

Figure 2B:
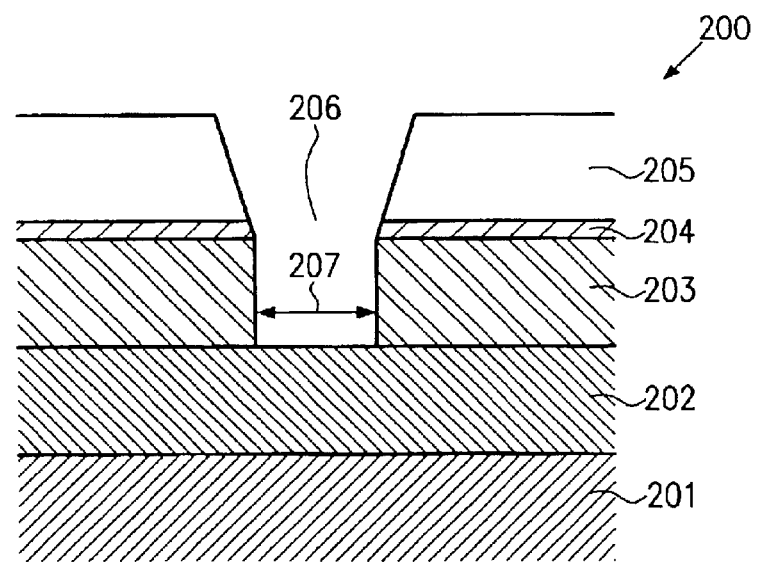

FIG. 2b schematically shows the semiconductor structure 200 after completion of the lithography process and the subsequent etch step to obtain a trench 206 in the photoresist layer 205, the ARC layer 204 and the underlying sacrificial layer 203. The trench 206 formed in the sacrificial layer 203 has a lateral dimension, indicated by 207, that is determined by well-known and well-established lithography and etching processes and significantly exceeds a desired design width of the line element to be formed. The trench 206 is formed by anisotropic etch procedures, such as reactive ion etching or plasma etching, which are well known in the art and will, accordingly, not be described in detail.

Figure 2C:
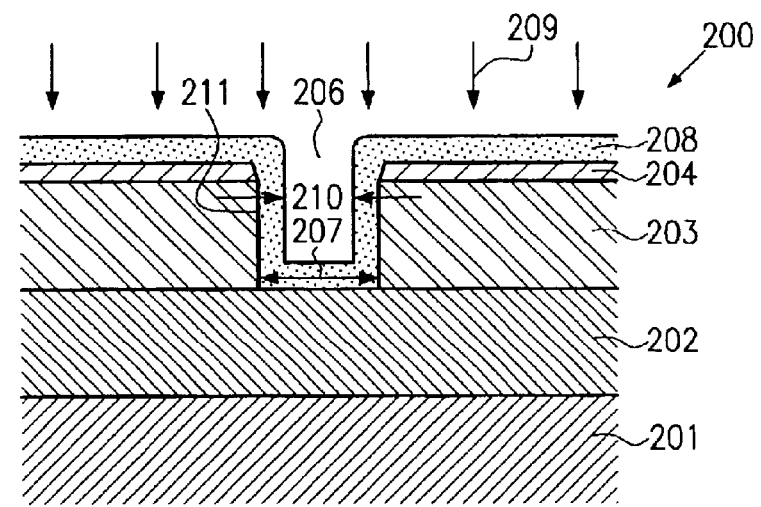

FIG. 2c depicts the semiconductor structure 200 with a spacer layer 208 that is conformally formed over the semiconductor structure 200 and, in particular, covers sidewalls 211 of the trench 206 to define a reduced width 210, the size of which is defined by the layer thickness of the spacer layer 208. The spacer layer 208 may be formed of, for example, silicon dioxide, that may be deposited by low pressure or plasma enhanced chemical vapor deposition, wherein process parameters are selected to obtain a high degree of conformability. Especially, a thickness variation along the sidewalls 211 is preferably less than a few nanometers and more preferably on the order of 1 nm. Such conformal deposition techniques are well established in process sequences for the manufacturing of sidewall spacers of gate electrodes required for the formation of highly sophisticated field effect transistors. For example, in one illustrative embodiment, the width of the trench 207 is in the range of 120–140 nm, and the thickness of the spacer layer 208 is selected to be in the range of 40–50 m so as to obtain the reduced width 210 with a magnitude in conformity with the design requirements. Subsequently, an anisotropic etch process is performed, as indicated by 209, to remove the material at the bottom of the trench 206.

Figure 2D:
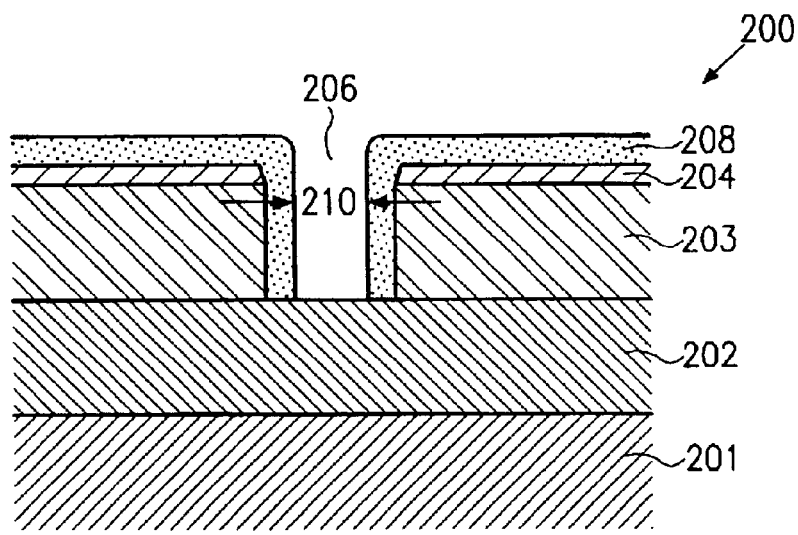

FIG. 2d schematically shows the semiconductor structure 200 after completion of the anisotropic etch process 209 with the material at the bottom of the trench 206 and on top of the stack partially or substantially being removed. The layer thickness of the spacer layer 208 within the trench 206 may be less than the thickness at large horizontal portions outside the trench 206 so that a residual of the spacer layer 208 may be maintained outside the trench 206 after completion of the anisotropic etch process 209.

Figure 2E:
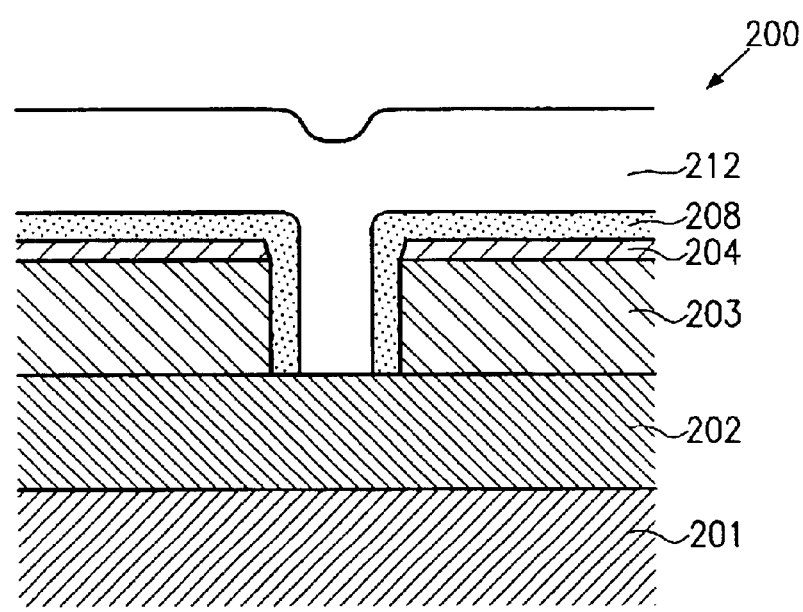

FIG. 2e shows the semiconductor structure 200 with a layer 212 of mask material deposited on the spacer layer 208 and filled in the trench 206. The mask material 212 is preferably a material that exhibits an etch selectivity with respect to the adjacent spacer layer 208 and the sacrificial layer 203. For example, silicon nitride may be used that exhibits an excellent etch selectivity to silicon dioxide.

The mask layer 212 is preferably deposited by low pressure or plasma enhanced CVD, wherein the ratio of silicon to nitride may be varied in accordance with process requirements. Subsequently, the semiconductor structure 200 is subjected to a chemical mechanical polishing (CMP) to remove excess material 212 and to planarize the surface of the semiconductor structure 200.

Figure 2F:
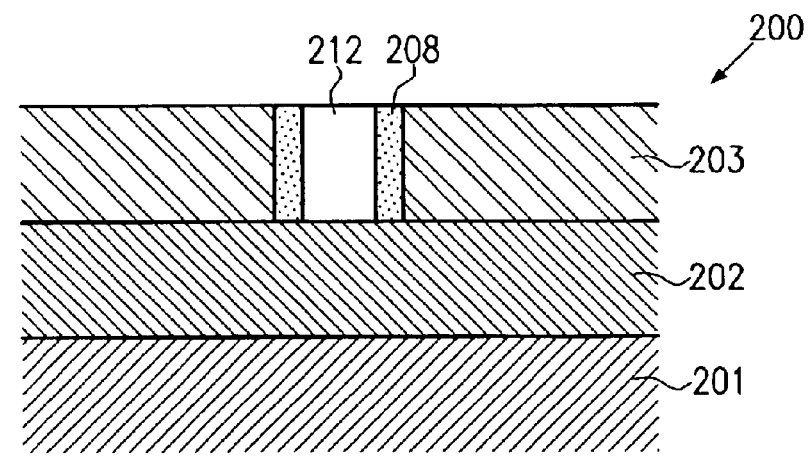

FIG. 2f schematically shows the semiconductor structure 200 after completion of the CMP process, wherein, according to one embodiment, the CMP process is carried out until the residual spacer layer 208 and the ARC layer 204 have been removed except for the sidewalls 211. As a result, a mask line element which is, for the sake of simplicity, also denoted by reference number 212, is enclosed by spacer elements which are also denoted by the reference number 208. The CMP of insulating materials, such as silicon dioxide, silicon oxynitride and silicon nitride, is a well-established process technique and, thus, the description thereof will be omitted.

Subsequently, a selective etch process is carried out to remove the sacrificial layer 203 and the spacer elements 208. In embodiments using silicon dioxide as the sacrificial layer 203 and the spacer elements 208, any of the well-known and well-established oxide etch processes may be carried out that exhibit a high selectivity with respect to the underlying first layer 202, which, in some embodiments, may be a polysilicon layer.

Figure 2G:
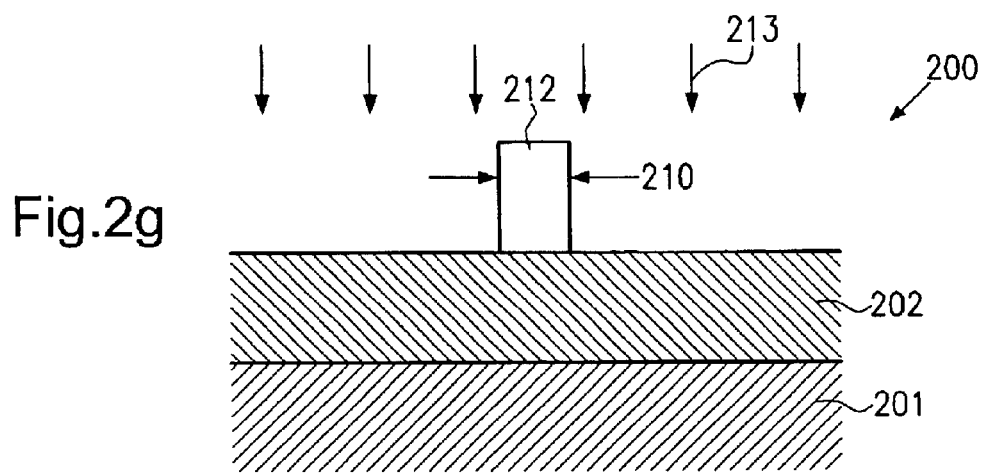

FIG. 2g schematically shows the semiconductor structure 200 after completion of the selective removal of the spacer elements 208 and the sacrificial layer 203. The mask line element 212, exhibiting substantially a specified design width 210, is formed on top of the first layer 202 in which the line element is to be formed. A further anisotropic etch process, indicated by 213, is performed to correspondingly pattern the first layer 202. The corresponding anisotropic etch process is also a well-established process and a corresponding description will be omitted.

Figure 2H:
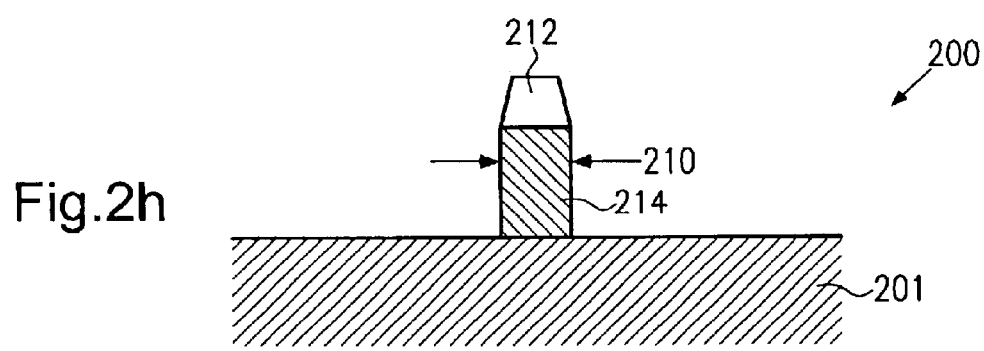

FIG. 2h shows the semiconductor structure 200 with a line element 214 substantially exhibiting the required specified design width 210 that is obtained by using the mask line element 212 as an etch mask during the etch process 213. Thus, the specified design width 210, in the exemplary embodiments described above, on the order of 50 nm and less, may be obtained by using well-established and well-controllable deposition and etch processes, wherein the design width 210 is substantially determined by the deposition parameters in forming the spacer layer 208 so that the specified design width 210 is adjustable within a relatively wide range without requiring changes in any of the preceding and subsequent processes. Thus, line elements having feature sizes far beyond the presently available lithographic techniques may be obtained by using a process sequence of a previous generation of microstructures, thereby allowing the development of a process sequence for a newly-scaled device generation in a relatively short time period.

Figure 3A:
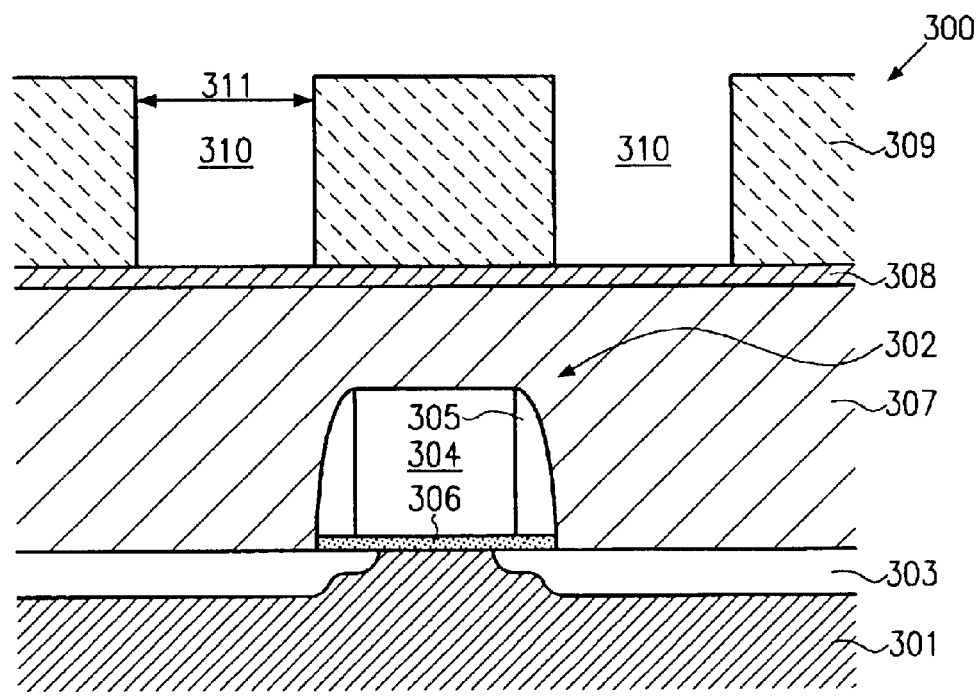
FIGS. 3*a*–3*c* schematically show cross-sectional views of a field effect transistor during various manufacturing stages in forming contact holes to source and drain regions in accordance with a further illustrative embodiment of the present invention.
Figure 3B:
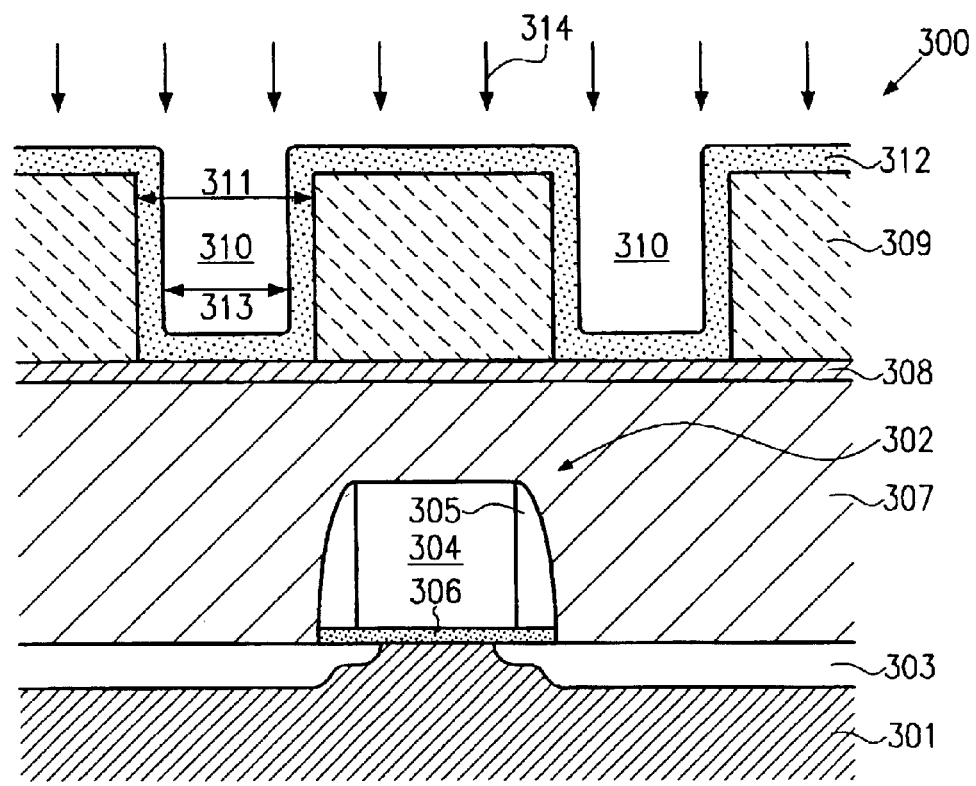
Figure 3C:
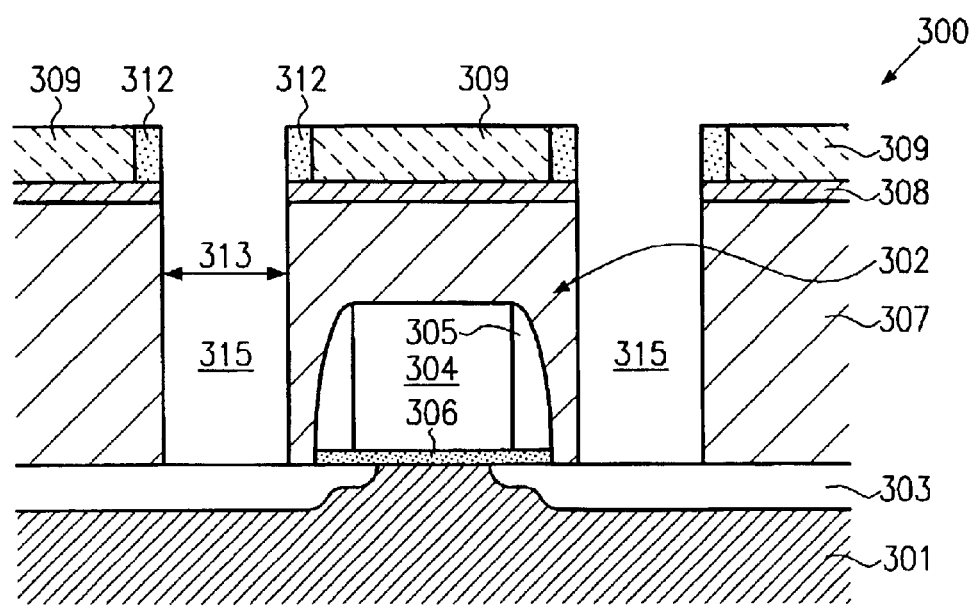

With reference to FIGS. 3a–3c, further illustrative embodiments of the present invention will now be described, wherein an opening is formed in a specific material layer, whereby the opening has a specified design size that is controlled by a deposition process. In the following embodiments, it is referred to as a contact hole being formed in an insulating layer in order to provide electrical contact to the source and drain regions of a field effect transistor. The field effect transistor may have a gate electrode that has been formed in accordance with the above embodiments, and, thus, the transistor may require correspondingly scaled contact openings. It should be understood, however, that the method described below is applicable to the formation of any opening to be formed in a material layer of a microstructure.

In FIG. 3a, a semiconductor structure 300 comprises a substrate 301, on and in which a field effect transistor 302 is formed. The field effect transistor 302 comprises drain and source regions 303, a gate electrode 304, sidewall spacers 305 and a gate insulation layer 306. A first insulating layer 307 is formed over the field effect transistor 302. The insulating layer 307 may be comprised of any suitable material, such as silicon dioxide and the like. An etch stop layer 308, which may also serve as a buried anti-reflecting coating, may be formed on top of the insulating layer 307. A second insulating layer 309 is formed on top of the etch stop layer 308, wherein openings 310 are formed in the layer 309 in correspondence to the source and drain regions 303. The openings 310 have a size 311, i.e., a diameter if contact vias are considered, or a width if trench-like openings are considered, that is greater than the specified design size of the contact opening to be formed.

The process flow for forming the semiconductor structure 300 and in particular the opening 310 having the size 311 are well-established process steps and the description thereof will be omitted. In particular, forming and patterning the insulating layer 309 may be carried out in a quite similar fashion as described with reference to FIGS. 2a and 2b and any explanations given there also apply in this case.

FIG. 3b schematically shows the semiconductor structure 300 with a spacer layer 312 formed over the structure 300. As previously explained with reference to spacer layer 208, the spacer layer 312 is deposited in a highly conformal fashion to achieve a high degree of uniformity at the sidewalls of the openings 310. The thickness of the spacer layer 312 at the sidewalls of the opening 310 defines a specified design size 313. Depending on the further processing and design requirements, the spacer layer 312 may be comprised of silicon dioxide, silicon nitride, and the like. Subsequently, the structure 300 is subjected to an anisotropic etch process, as indicated by 314, to form an opening substantially having the specified design size 313.

FIG. 3c schematically shows the semiconductor structure 300 after completion of the anisotropic etch process 314. Contact openings 315 are formed in the insulating layer 317, wherein a size of the openings 315 substantially corresponds to the size 313 defined by the spacer layer 312 in FIG. 3b. In the embodiment shown in FIG. 3c, the insulating layer 307, the insulating layer 309 and the spacer layer 312 may be formed of substantially the same material or may be formed of different materials, wherein a selectivity with respect to the anisotropic etch process 314 is not required. As can be seen from FIGS. 3b and 3c, the insulating layer 309, in combination with the spacer layer 312, act as an etch mask and the contact openings 315 are etched through the openings 310. If no etch selectivity between the materials 309, 307 and 312 is provided, the insulating layer 309 and the spacer layer 312 will also be removed while the openings 315 are etched. In case the etch stop layer 308 is provided, it may be necessary to use an etch process, other than the process 314, after the spacer layer 312 is removed from the bottom of the opening 310 (see FIG. 3b) to remove the etch stop layer 308 within the openings 310. Subsequently, the etch process 314 may be continued to form the contact openings 315. When providing the etch stop layer 308, the initial total thickness of the insulating layer 309 and of the spacer layer 312 is not critical, except for the fact that the thickness of the spacer layer 312 has to be selected to adjust the design size 313, since the etch process 314 will stop at the etch stop layer 308, even if the etch process has not yet reached the bottom of the contact openings 315. Thus, in one embodiment (not shown), the initial thickness of the insulating layer 309 is selected so that the layer 309 and the spacer layer 302 are substantially completely removed upon etching the contact openings 315.

In other embodiments, the spacer layer 312 may be formed of a material that exhibits a high etch selectivity with respect to the material of the insulating layer 309, and a first anisotropic etch process is performed to remove the spacer layer 312 at the bottom of the openings 310, similarly as described with reference to FIG. 2c. Subsequently, the openings 315 are etched, wherein the insulating layer 309 is protected by the residual of the overlying spacer layer 312. Subsequently, the spacer layer 312 may be removed in a selective etch process to form the contact holes 315 having the required design size 313 in a lower portion thereof and having the size 311 in an upper portion thereof.

In a further illustrative embodiment, the contact openings 315 as shown in FIG. 3c may be filled with a conductive material, and excess material, including the excess material of the insulating layer 309 and the spacer layer 312, may be removed by chemical mechanical polishing.

It should be noted that the process of forming the contact openings 315 not only allows one to scale the device dimensions, but also relaxes to a certain degree overlay concerns that would otherwise occur, since the required overlay accuracy is substantially determined by the well-established formation process for the mask openings 310 and does not need to be "scaled" in accordance with the finally obtained contact openings 315.

Figure 4A:
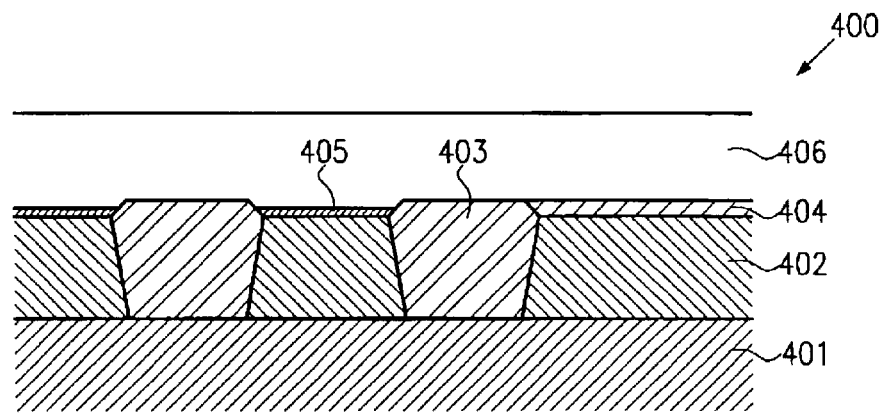
FIGS. 4*a*–4*h* schematically show cross-sectional views of a semiconductor structure including gate electrodes formed on gate insulation layers of different thickness according to further illustrative embodiments of the present invention.

With reference to FIGS. 4a–4h, further illustrative embodiments will now be described. In FIG. 4a, a semiconductor structure 400 comprises a substrate 401, for example, an SOI substrate, including a buried insulating layer such as a silicon dioxide layer. The substrate 401 further comprises semiconductor regions, such as silicon regions 402 that are isolated from each other by insulation regions 403, for example, shallow trench isolation regions. On the semiconductor regions 402, gate insulation layers 404 and 405 are provided that may exhibit different layer thicknesses according to design requirements. For example, the gate insulation layer 404 may be designed for a low leakage transistor element and may, thus, be relatively thick, whereas the gate insulation layer 405 may be designed for a fast switching transistor element and may, thus, exhibit a relatively small thickness.

Process flows for forming the structure 400 as shown in FIG. 4a are well known and well established in the art and will not be described in detail. Moreover, although the semiconductor structure 400 represents an SOI device, the present invention is also applicable to bulk semiconductor devices.

Figure 4B:
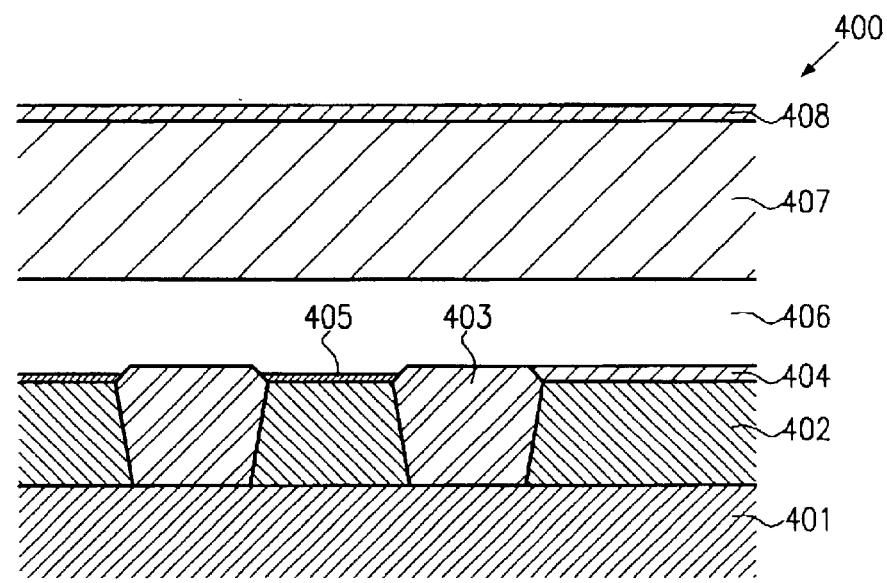

In FIG. 4b, the semiconductor structure 400 additionally comprises a sacrificial layer 407 and an ARC layer 408 formed above a gate electrode material layer 406. As previously explained with reference to FIGS. 2a–2h and 3a–3c, the sacrificial layer 407 may be comprised of silicon dioxide and the ARC layer 408 may be comprised of silicon oxynitride. Regarding the characteristics of the layers 407 and 408 and the deposition techniques used in forming these layers, the same criteria apply as already pointed out with reference to the embodiments described above.

Figure 4C:
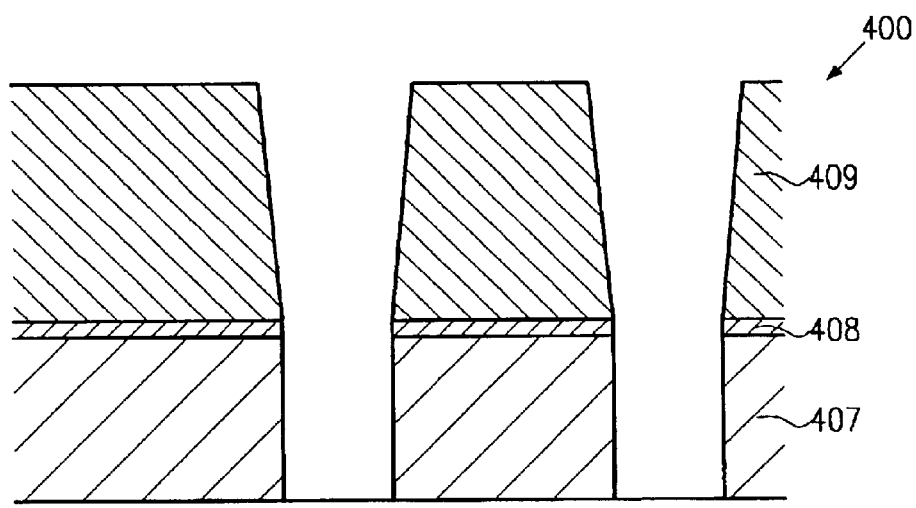

FIG. 4c depicts the semiconductor structure 400 with an additional photoresist layer 409 and openings 410 with a size 411 patterned in the ARC layer 408 and the sacrificial layer 407. Depending on design requirements, the size 411 of the openings 410 formed above the gate insulation layers 404 and 405 may differ from each other. Regarding the formation of the openings 410, the same criteria apply as already given with reference to FIGS. 2a–2h and 3a–3c.

Figure 4D:
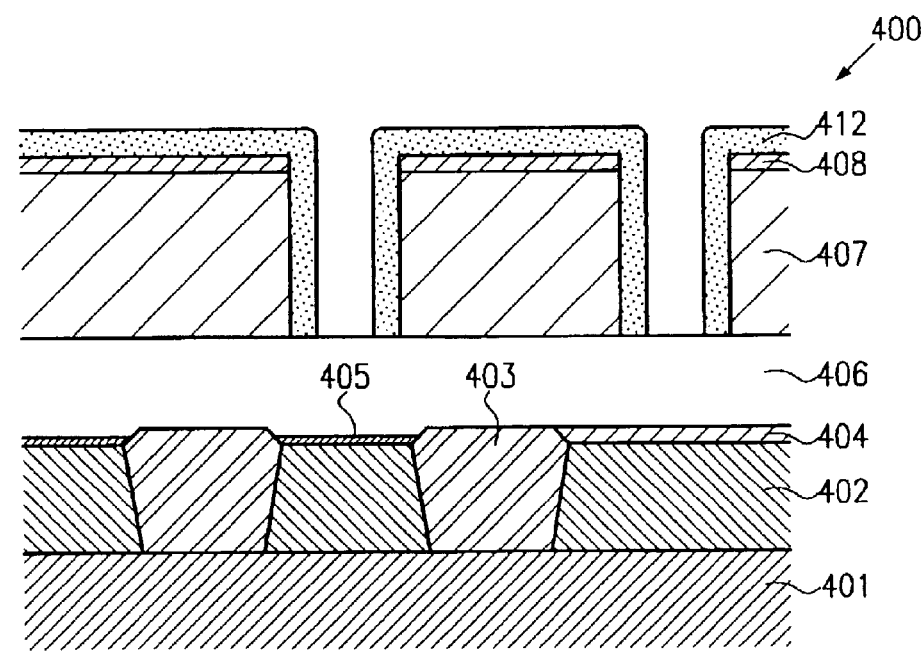

In FIG. 4d, a spacer layer 412 is formed on the ARC layer 408 and within the opening 410 to define a specified size 413 that, as noted above, may be different for the openings 410 formed over the gate insulation layers 404 and 405. As previously explained, the deposition parameters are controlled to obtain the specified design size 413, and an anisotropic etch process will be performed to remove the material at the bottom of the openings 410.

Figure 4E:
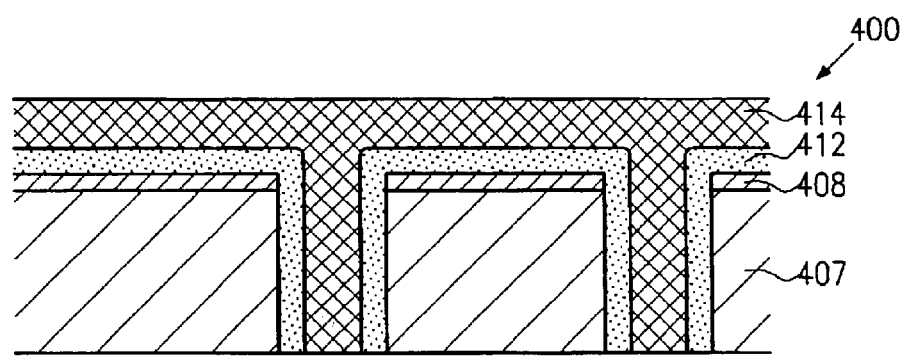

In FIG. 4e, a mask layer 414 is deposited over the semiconductor structure 400 so as to completely fill the openings 410. The material comprising the mask layer 414 may exhibit a high etch selectivity with respect to the material of the spacer layer 412 and the sacrificial layer 407. For example, the mask layer 414 may be comprised of silicon nitride, wherein the ratio of silicon to nitride may be controlled during the deposition process to adjust the characteristics of the mask layer 414.

Figure 4F:
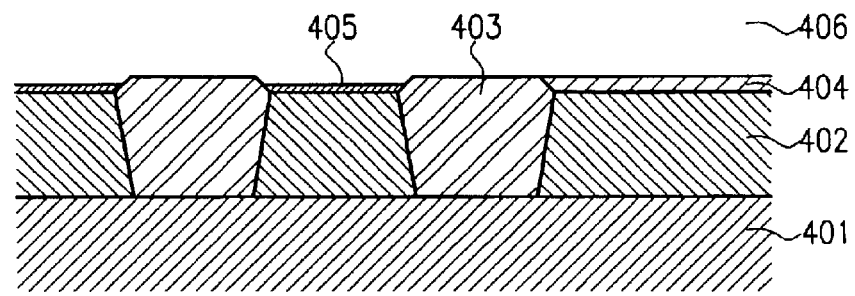

FIG. 4f shows the semiconductor structure 400 after removing excess material and planarizing the resulting surface by means of chemical mechanical polishing. For convenience, the spacer elements enclosing the mask material within the openings 410 and the mask material are denoted with the same reference numbers as the initial material layers. Subsequently, a selective etch process is carried out to remove the spacer elements 412 and the sacrificial layer 407.

Figure 4G:
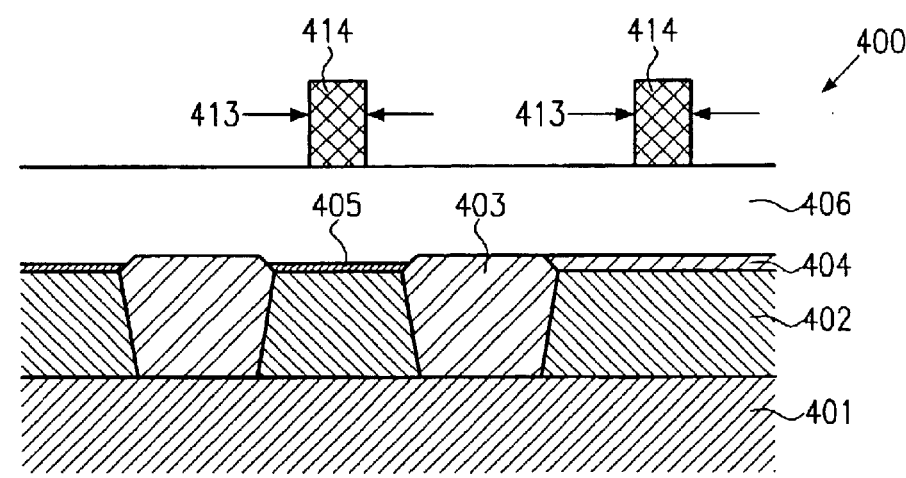

FIG. 4g shows the structure 400 after completion of the selective etch process with the hard mask 414 located over the respective gate insulation layers 405 and 404. Subsequently, an anisotropic etch process is carried out to pattern gate electrodes in the gate electrode material layer 406.

Figure 4H:
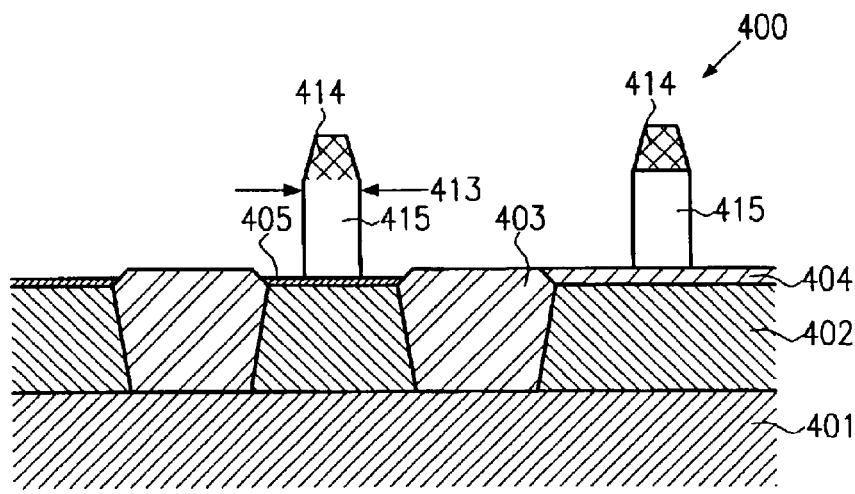

FIG. 4h schematically shows the semiconductor structure 400 after the patterning of gate electrodes 415 substantially exhibiting the specified design width 413. As previously noted, the design width 413 of the gate electrode 415 located on the gate insulation layer 404 may differ from that of the gate electrode 415 located on the gate insulation layer 405. Preferably, the gate electrode 415 having the greater width is formed on the gate insulation layer 404 having a greater layer thickness.

As is evident from the above explained embodiments, the gate insulation layers 404 and 405 are not affected by the patterning processes involved in obtaining the specified design width 413, except for the very last etch process. Thus, the present invention allows the production of gate electrodes without compromising the integrity of the underlying gate insulation layers, irrespective whether a single layer thickness of the gate insulation layer or differing thicknesses of the gate insulation layers are to be dealt with.

Moreover, in the embodiments described so far, the specific design width or size of an opening or a line element has been adjusted by carrying out a single deposition process for forming a spacer layer, the thickness of which on the sidewalls of openings and trenches determines the specific design width. In embodiments requiring different design sizes of similar structure elements, the mask openings formed by lithography may then correspondingly be scaled to obtain the desired design size. In other embodiments, it may be considered appropriate not to alter the lithography mask, but instead provide two or more deposition steps to obtain different design sizes at different substrate regions, as will be described with reference to FIGS. 5a–5c.

Figure 5A:
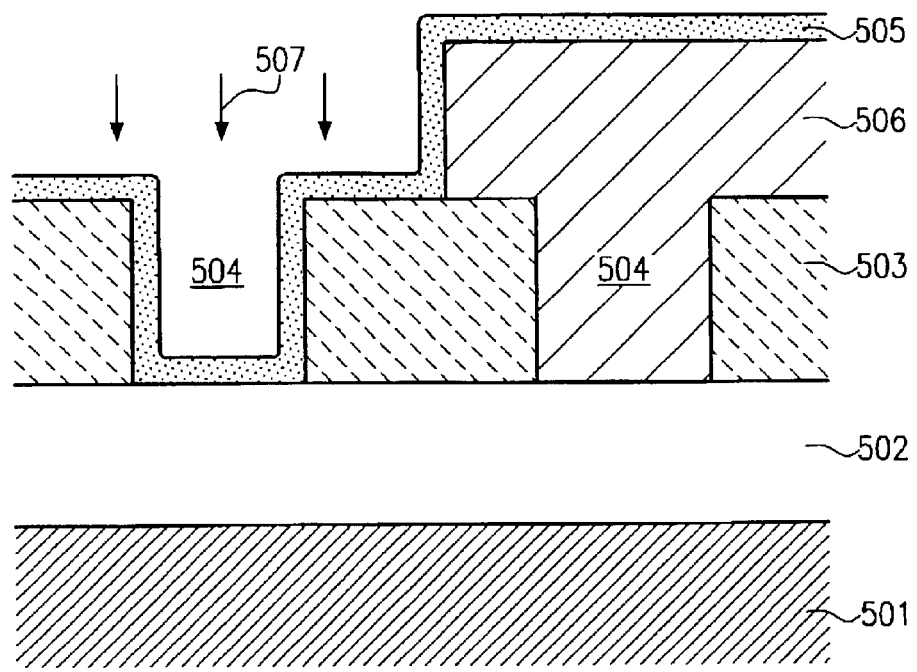
FIGS. 5*a*–5*c* schematically show cross-sectional views of a further illustrative embodiment of the present invention.

In FIG. 5a, a semiconductor structure 500 comprises a substrate 501 having formed thereon a layer 502, in which an opening or a line element is to be formed. A sacrificial layer 503 includes openings 504 that have been formed in accordance with processes as previously described. One of the openings 504 is covered and filled by a resist mask 506 and a first spacer layer 505 is conformally formed over the structure 500. Subsequently, an anisotropic etch process is carried out, indicated by 507, to reduce a thickness of the first spacer layer 505 on horizontal portions and to remove material from the bottom of the uncovered opening 504.

Figure 5B:
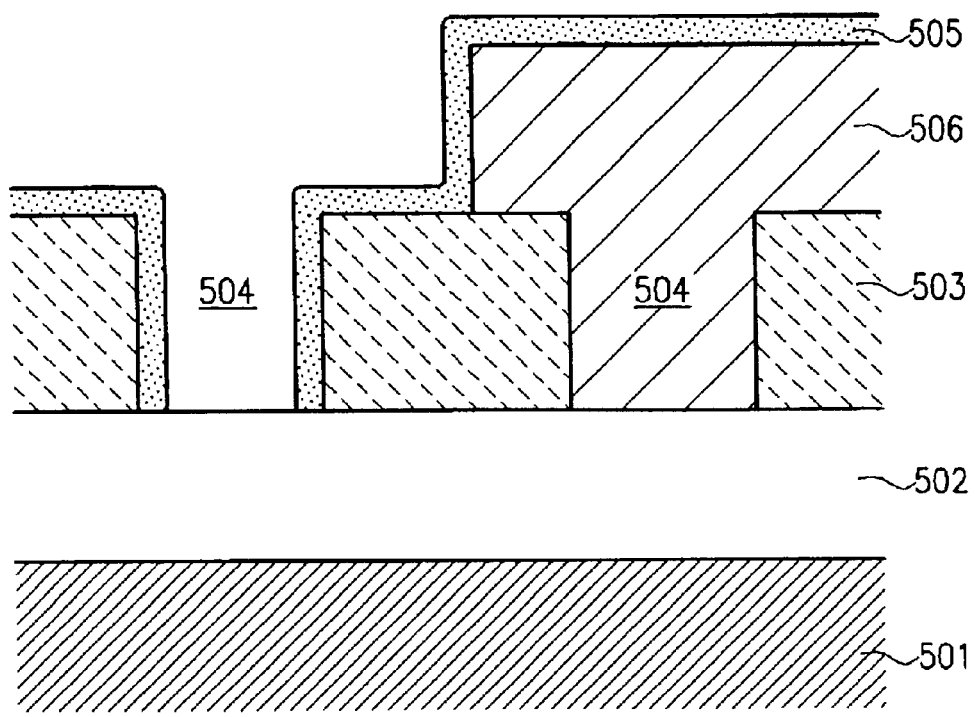

FIG. 5b schematically shows the resulting structure after completion of the anisotropic etch process. Subsequently, the resist mask 506 is removed, for example, by heating the substrate 502 to soften the resist mask 506. In other embodiments, the anisotropic etch process 507 may be continued until substantially all of the horizontal portions of the first spacer layer 505 are removed and the resist mask 506 is subsequently etched by conventional resist removal processes.

Figure 5C:
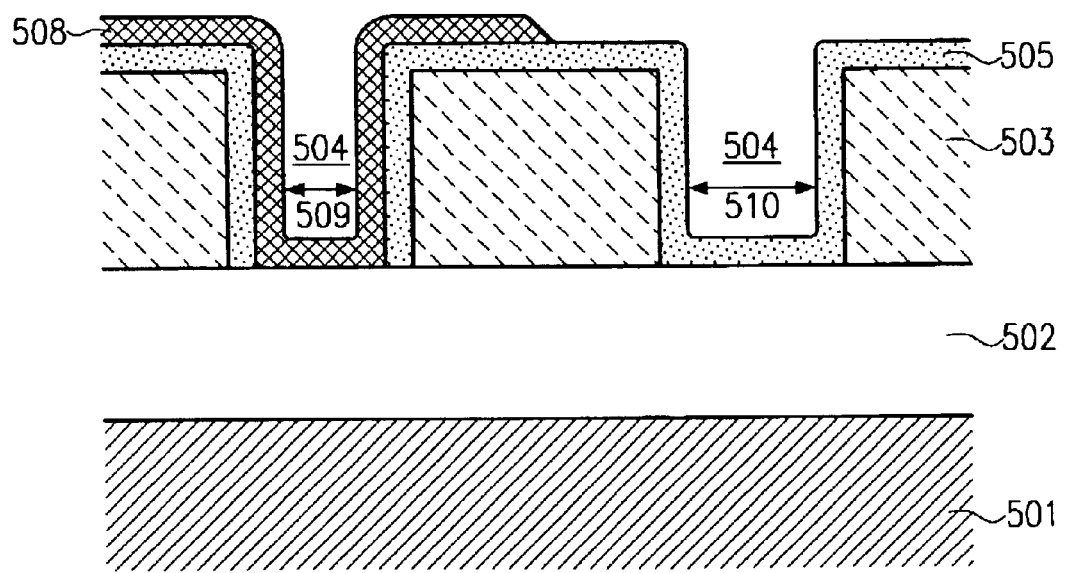

FIG. 5c shows the semiconductor structure 500 after deposition of a second spacer layer 508 conformally formed over the structure 500 so as to form a first specific design width 509 that is determined by the sum of the thickness of the first and second spacer layers 505 and 508 and a second specified design width 510. Regarding the deposition of the second spacer layer 508 and the characteristics thereof, the same criteria apply as already pointed out with the explanations given with reference to FIGS. 2a–2h, 3a–3c and 4a–4h. Thus, different design widths may be obtained by using the same lithographic technique in forming the openings 504 by applying the first in the second spacer layers. Moreover, in other embodiments, the steps of masking a certain substrate region and sequentially providing a spacer layer may be repeated three times or more in accordance with design requirements. The further processing of the semiconductor structure 500 may be continued as is described in the preceding embodiments.

As a result, the present invention allows the formation of elements of microstructures having dimensions well beyond the resolution of conventional lithographic techniques, wherein already well-established and controllable deposition and etch procedures are performed to obtain critical dimensions well beyond the resolution of the involved photolithography process. In particular, the present invention allows the formation of feature sizes with critical dimensions of 50 nm and less by employing well-known process techniques.

The present invention allows the production of gate electrodes without compromising the integrity of the underlying gate insulation layers, irrespective whether a single layer thickness of the gate insulation layer or differing thicknesses of the gate insulation layers are to be dealt with.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a line element, the method comprising:

providing a substrate having formed thereon a first material layers, a second material layer located above the first material layer, and an anti-reflective coating above the second material layer;

forming a trench in the anti-reflective coating and the second material layer, the trench having a width exceeding a design width of the line element to be formed;

depositing a spacer layer on the anti-reflective coating and on the sidewalls of said trench to reduce the trench width;

filling said trench with a mask material;

removing the anti-reflective coating, the second material layer and the spacer layer; and patterning the line element in said first material layer while using the mask material as an etch mask to substantially define a width of said line element in accordance with said design width.

2. The method of claim 1, wherein forming a spacer layer on the sidewalls of said trench includes conformally depositing the spacer layer while controlling a thickness of the spacer layer.

3. The method of claim 2, wherein forming a spacer layer on the sidewalls of said trench further includes anisotropically etching said spacer layer to remove material at the bottom of said trench.

4. The method of claim 1, wherein removing the anti-reflective coating, the second material layer and the spacer layer includes chemically mechanically polishing the substrate.

5. The method of claim 1, wherein the second material layer and the spacer layer are selected to have an etch selectivity with respect to the first material layer, and the second material layer and the spacer layer are removed by a selective etch process.

6. The method of claim 1, wherein the width of said trench is in the range of approximately 100–200 nm.

7. The method of claim 1, wherein said design width is less than 50 nm.

8. The method of claim 1, wherein forming said trench includes a photolithographic technique using ultraviolet radiation with a wavelength of approximately 193 nm.

9. The method of claim 1, wherein said line element is a gate electrode of a field effect transistor to be formed on said substrate.

10. A method of forming a gate electrode of a field effect transistor, the method comprising:

providing a substrate having formed thereon a semiconductor layer covered by a gate insulation layer;

depositing a layer of gate electrode material on said gate insulation layer;

forming a sacrificial layer over said layer of gate electrode material;

forming an anti-reflective coating on said sacrificial layer;

forming an opening in said anti-reflective coating and said sacrificial layer, said opening having a shape and dimensions that correspond to the gate electrode to be formed, wherein the dimensions of the opening exceed specific design dimensions of said gate electrode;

conformally depositing a spacer layer over said anti-reflective coating and in said opening to reduce the dimensions of said opening so as to substantially correspond to the specific design dimensions;

filling said opening with a mask material;

removing the anti-reflective coating, the spacer layer and the sacrificial layer to obtain an etch mask; and anisotropically etching the substrate using said etch mask to form the gate electrode, the dimensions of which are substantially determined by said etch mask.

11. The method of claim 10, wherein conformally depositing said spacer layer includes anisotropically etching said spacer layer to remove material from the bottom of said opening.

12. The method of claim 11, wherein conformally depositing said spacer layer includes controlling a layer thickness at the sidewalls of said opening.

13. A method of forming a microstructure element including an opening of a specified design size, the method comprising:

providing a substrate having formed thereon a material layer in which the opening is to be formed;

forming a sacrificial layer on said material layer;

forming an anti-reflective coating on said sacrificial layer;

forming a mask opening in said sacrificial layer, said mask opening having a size that exceeds said specified design size;

conformally depositing a spacer layer over said anti-reflective coating and in said mask opening to adjust the size to the specified design size; and forming said opening by anisotropically etching through said mask opening.

14. The method of claim 13, wherein forming said opening comprises:

anisotropically etching said spacer layer to remove said spacer layer at the bottom of the mask opening;

etching said intermediate layer; and anisotropically etching said material layer to form said opening.

15. The method of claim 13, wherein an initial layer thickness of said sacrificial layer is selected such that the sacrificial layer is substantially completely removed while anisotropically etching said spacer layer.

16. The method of claim 13, further comprising removing said spacer layer and said sacrificial layer by chemical mechanical polishing of the substrate.

17. The method of claim 13, wherein said opening is a contact hole in an integrated circuit.

18. A method of forming differently sized microstructure elements, the method comprising:

providing a substrate having formed thereon a material layer in which said microstructure elements are to be formed;

forming a sacrificial layer on said material layer;

forming a first opening and a second opening in said sacrificial layer;

forming a first spacer layer over said sacrificial layer and in said first and second openings to obtain a first reduced size of said first opening and a first reduced size of said second opening; and forming a second spacer layer over a portion of the first spacer layer and in the second opening to obtain a second reduced size of the second opening, said second reduced size of said second opening being less than said first reduced size of said first opening, wherein the first reduced size of the first opening and the second reduced size of the second opening substantially correspond to design sizes of a first microstructure element and a second microstructure element.

19. A method of forming differently sized microstructure elements, the method comprising:

providing a substrate having formed thereon a material layer in which said microstructure elements are to be formed;

forming a sacrificial layer on said material layer;

forming a first opening and a second opening in said sacrificial layer;

forming a first spacer layer over said sacrificial layer and in said first opening to obtain a first reduced size of said first opening; and forming a second spacer layer over a portion of the first spacer layer, in the first opening having said reduced first size, and in the second opening to obtain a second reduced size of said first opening and a first reduced size of the second opening, said second reduced size of said first opening being less than said first reduced size of said second opening, wherein the second reduced size of the first opening and the first reduced size of the second opening substantially correspond to design sizes of a first microstructure element and a second microstructure element.

20. A method of forming a gate electrode of a field effect transistor, the method comprising:

providing a substrate having formed thereon a semiconductor layer covered by a first gate insulation layer and a second gate insulation layer, wherein a thickness of the first gate insulation layer is greater than a thickness of the second gate insulation layer;

depositing a layer of gate electrode material on said first and second gate insulation layers;

forming a sacrificial layer over said layer of gate electrode material;

forming an opening in said sacrificial layer, said opening having a shape and dimensions that correspond to the gate electrode to be formed, wherein the dimensions of the opening exceed specific design dimensions of said gate electrode;

conformally depositing a spacer layer over said opening to reduce the dimensions so as to substantially correspond to the specific design dimensions;

filling said opening with a mask material;

removing the spacer layer and the sacrificial layer to obtain an etch mask; and anisotropically etching the substrate using said etch mask to form the gate electrode, the dimensions of which are substantially determined by said etch mask.

* * * * *

UNITED STATES PATENT AND TRADEMARK OFFICE
CERTIFICATE OF CORRECTION

PATENT NO.     : 6,936,383 B2  
DATED          : August 30, 2005  
INVENTOR(S)    : Matin Mazur et al.

It is certified that error appears in the above-identified patent and that said Letters Patent is hereby corrected as shown below:

<u>Column 11,</u>
Line 65, change "layers," to -- layer, --.

Signed and Sealed this

First Day of November, 2005

JON W. DUDAS  
*Director of the United States Patent and Trademark Office*